(12) United States Patent
Xu et al.

(10) Patent No.: US 10,476,380 B2
(45) Date of Patent: Nov. 12, 2019

(54) COMMON-MODE CHOKE FOR PARALLELED POWER SEMICONDUCTOR

(71) Applicant: FORD GLOBAL TECHNOLOGIES, LLC, Dearborn, MI (US)

(72) Inventors: Fan Xu, Novi, MI (US); Lihua Chen, Farmington Hills, MI (US); Shahram Zarei, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/871,770

(22) Filed: Jan. 15, 2018

(65) Prior Publication Data

US 2019/0222118 A1 Jul. 18, 2019

(51) Int. Cl.
| | |
|---|---|
| *H02M 1/00* | (2006.01) |
| *H02M 1/44* | (2007.01) |
| *H01F 27/28* | (2006.01) |
| *H02M 1/088* | (2006.01) |
| *H02M 7/537* | (2006.01) |
| *H05K 1/18* | (2006.01) |
| *H01F 27/24* | (2006.01) |
| *H02P 27/06* | (2006.01) |
| *H05K 1/09* | (2006.01) |

(52) U.S. Cl.
CPC .......... *H02M 1/44* (2013.01); *H01F 27/2804* (2013.01); *H02M 1/088* (2013.01); *H02M 7/537* (2013.01); *H05K 1/181* (2013.01); *H01F 27/24* (2013.01); *H01F 2027/2809* (2013.01); *H02P 27/06* (2013.01); *H05K 1/09* (2013.01); *H05K 2201/10166* (2013.01)

(58) Field of Classification Search
CPC .......... H02M 1/088; H02M 1/44; H01F 27/24
See application file for complete search history.

(56) References Cited

U.S. PATENT DOCUMENTS

| | | | |
|---|---|---|---|
| 7,547,992 B2 | 6/2009 | Hiyama | |
| 7,969,208 B2 | 6/2011 | Jansen | |
| 9,691,538 B1* | 6/2017 | Ikriannikov | .............. H01F 3/10 |
| 2004/0179383 A1* | 9/2004 | Edo | .......... H01F 27/24 363/111 |
| 2016/0294346 A1* | 10/2016 | Xu | .......... H05K 1/0231 |

FOREIGN PATENT DOCUMENTS

| | | |
|---|---|---|
| EP | 2466751 A1 | 6/2012 |
| EP | 2819285 A1 | 12/2014 |

* cited by examiner

*Primary Examiner* — Adolf D Berhane
*Assistant Examiner* — Afework S Demisse
(74) *Attorney, Agent, or Firm* — David Kelley; Brooks Kushman P.C.

(57) ABSTRACT

A power module includes a plurality of switching devices. The switching devices are electrically coupled in parallel and triggered by a common gate signal. The switching devices are further attached to a substrate that includes a first coil and a second coil formed around a common axis to define a common mode choke in a gate path and a Kelvin source/emitter path of each of the switching devices.

19 Claims, 7 Drawing Sheets

COMMON-MODE CHOKE FOR PARALLELED POWER SEMICONDUCTOR

TECHNICAL FIELD

This application generally relates to a common-mode choke circuit integrated with a power semiconductor module.

BACKGROUND

Hybrid-electric and electric vehicles use electrical energy for propulsion. To convert the electrical energy, power semiconductors are used. The power semiconductors are rated to carry a predetermined amount of current. In a typical application, power semiconductors are selected to carry more current than may be necessary. As current demand increases, the cost of the power semiconductors may increase. Further, as the current demand increases, additional thermal controls may be needed to maintain the power semiconductors within specified operating temperatures.

SUMMARY

A power module includes a plurality of switching devices, electrically coupled in parallel and triggered by a common gate signal, attached to a substrate that includes a first coil and a second coil formed around a common axis to define a common mode choke in a gate path and a Kelvin source/emitter path of each of the switching devices.

The gate input of the switching devices may be connected to the common gate signal through one of the first coil and the second coil. The Kelvin source/emitter output of the switching devices may be connected to a common control signal through one of the first coil and the second coil. A number of turns of the first coil may be equal to a number of turns of the second coil. The power module may further include a magnetic core inserted at a central position defined by the first coil and the second coil. The power module may further include an electrical insulating material between the first coil and the second coil. The first coil and the second coil may be formed as copper traces in the substrate. The first coil and the second coil may be in different planes of the substrate. The second coil may be concentric to the first coil.

A power module includes a plurality of switching devices, electrically coupled in parallel and triggered by a common gate signal, attached to a substrate that includes a first trace and a second trace formed around a common axis in different planes to define a common mode choke in a gate path and a Kelvin source/emitter path of each of the switching devices.

One of the first trace and the second trace may form a coil in the gate path that connects a gate input of the switching devices to the common gate signal. One of the first trace and the second trace may form a coil in the Kelvin source/emitter path that connects a Kelvin source/emitter output of the switching devices to a common control signal. A number of turns of the first trace may be equal to a number of turns of the second trace. The power module may further include a magnetic core inserted at a central position defined by the first trace and the second trace. The first trace and the second trace may be formed as copper traces on respective planes of the substrate.

A traction inverter includes a plurality of switching devices, electrically coupled in parallel and triggered by a common gate signal and a printed circuit board including traces that define a pair of windings for a common mode choke in a gate path and a Kelvin source/emitter path of each of the switching devices.

The traces may define the pair of windings in different planes of the printed circuit board. The traces may define the pair of windings such that each of the windings includes traces on different planes of the printed circuit board. The traction inverter may further include a magnetic core inserted in an opening defined by the printed circuit board and located within a central region defined by the windings. The windings may form a first coil in the gate path that connects a gate input of the switching devices to the common gate signal and a second coil in the Kelvin source/emitter path that connects a Kelvin source/emitter output of the switching devices to a common control signal.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
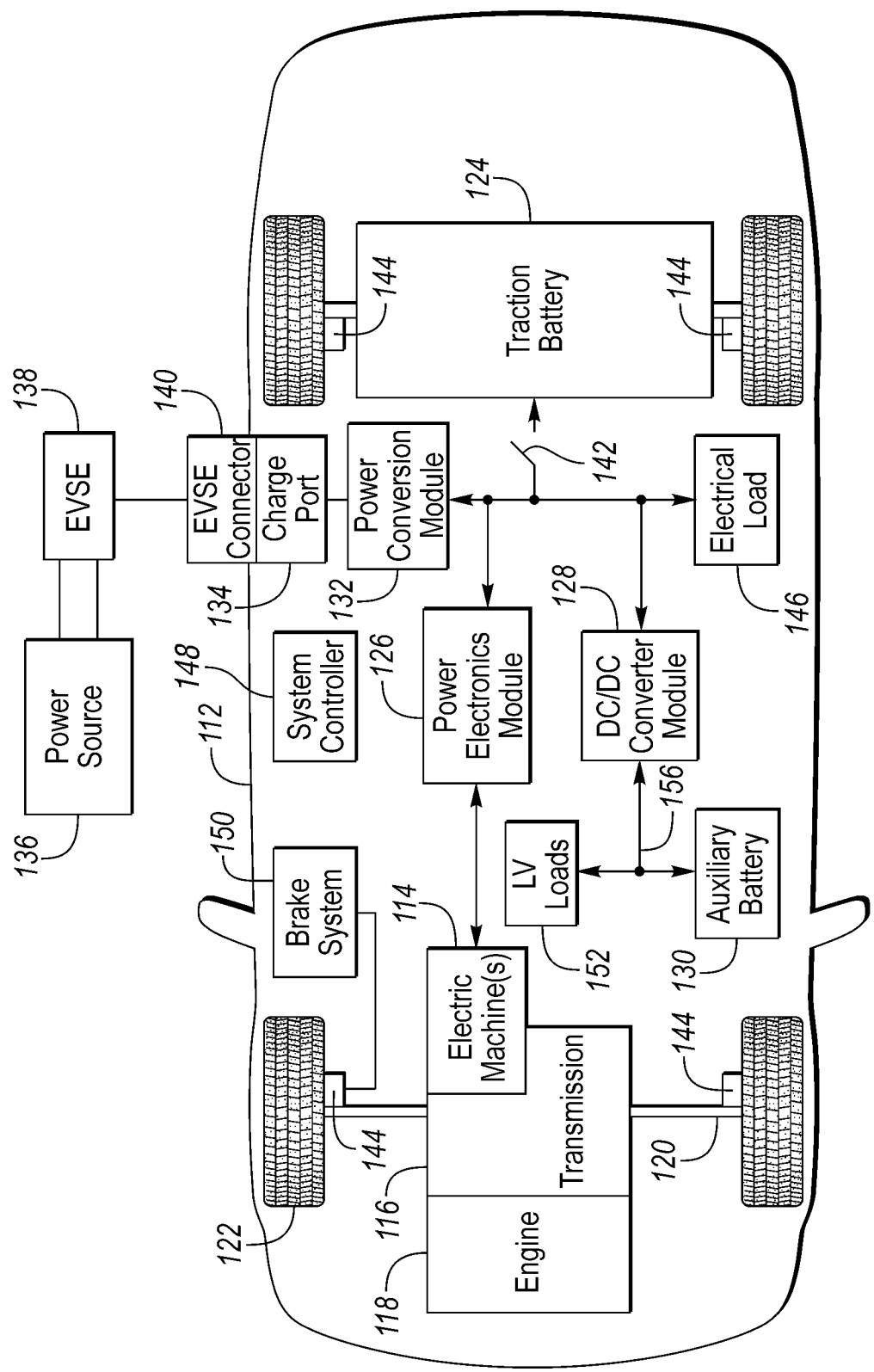
FIG. 1 is a diagram of an electrified vehicle illustrating drivetrain and energy storage components including an electric machine.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present.

A traction battery or battery pack 124 stores energy that can be used by the electric machines 114. The vehicle battery pack 124 may provide a high voltage direct current (DC) output. The traction battery 124 may be electrically coupled to one or more power electronics modules 126 (may also be referred to as a traction inverter). One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) (not shown) electrically coupled between the traction battery 124 and the power electronics module 126. The VVC may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

In some configurations, the electrified vehicle 112 may be configured to provide power to an external load. For example, the electrified vehicle may be configured to operate as a back-up generator or power outlet. In such applications, a load may be connected to the EVSE connector 140 or other outlet. The electrified vehicle 112 may be configured to return power to the power source 136. For example, the electrified vehicle 112 may be configured to provide alternating current (AC) power to the electrical grid. The voltage supplied by the electrified vehicle may be synchronized to the power line.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
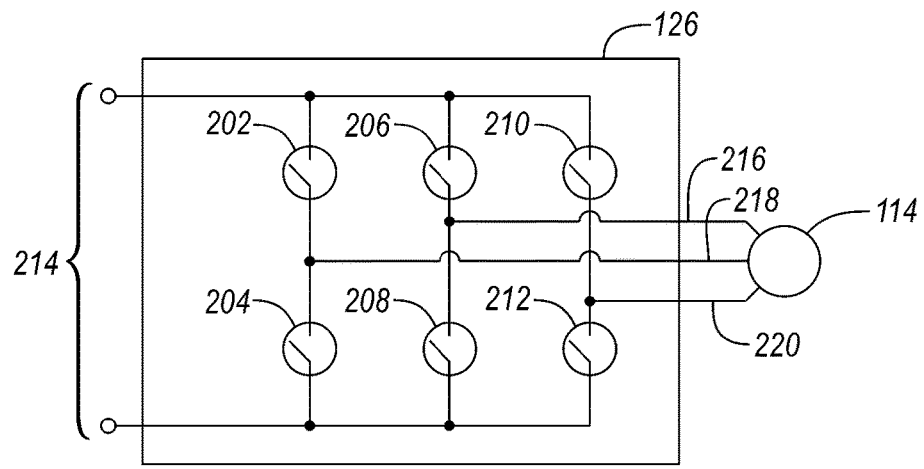
FIG. 2 is a diagram of a power inverter for an electric machine.

The electric machine 114 may be a three-phase AC machine. The electric machine 114 may have three phase inputs. The power electronics module 126 may be configured to provide the three-phase voltages/currents to the electric machine. FIG. 2 depicts a possible configuration of a traction inverter in the power electronics module 126. The power electronics module 126 may be configured to selectively couple voltage from a high-voltage DC bus 214 to each of the phase inputs of the electric machine 114. A first power switching module 202 may be configured to selectively couple a DC bus power terminal to a first phase input 218. A second power switching module 204 may selectively couple a DC bus return terminal to the first phase input 218. A third power switching module 206 may be configured to selectively couple a DC bus power terminal to a second phase input 216. A fourth power switching module 208 may selectively couple a DC bus return terminal to the second phase input 216. A fifth power switching module 210 may be configured to selectively couple a DC bus power terminal to a third phase input 220. A sixth power switching module 212 may selectively couple a DC bus return terminal to the third phase input 220.

The power switching modules may be comprised of one or more power switching devices. For example, the power switching device may be Insulated Gate Bipolar Transistors (IGBT), Metal Oxide Semiconductor Field Effect Transistors (MOSFET), or other solid-state switching devices. Each of the power switching modules may have an associated control input (e.g., gate input) for controlling operation of the power switching module. The control inputs may be electrically coupled to a controller that is configured to operate the power switching modules. It is realized that each of the phase inputs of the electric machine 114 are selectively coupled to each terminal of the high-voltage DC bus 214 by a pair of power switching modules. The power switching modules may be operated such that only one of the pair of power switching modules coupled to a phase input is switched on at a given time. In some configuration, a diode may be coupled across the power switching modules.

The power switching devices may include two terminals that handle the high-power current through the power switching device. For example, an IGBT includes a collector (C) terminal and an emitter (E) terminal and a MOSFET includes a drain terminal (D) and a source (S) terminal. The power switching devices may further include one or more control inputs. For example, the power switching device may include a gate terminal (G) and a Kelvin source/emitter (K) terminal. The G and K terminals may comprise a gate loop to control the power switching device.

The power switching modules may be configured to flow a rated current and have an associated power rating. Some applications may demand higher power and/or current ratings for proper operation of the electric machine 114. The power switching modules may be designed to include a power switching device that can handle the desired power/current rating. The desired power/current rating may also be achieved by using power switching devices that are electrically coupled in parallel. Power switching devices may be electrically coupled in parallel and controlled with a common control signal so that each power switching device flows a portion of the total current flowing to/from the load.

Issues may arise in applications in which power switching devices are controlled in parallel. Due to piece-to-piece variations of the power switching devices and non-uniform circuit layout, junction capacitances and circuit stray inductances may not be the same in each circuit path. As a result, switching transient currents of the paralleled power switching devices can be unbalanced and have different ringing frequencies and amplitudes. A circulating current between the paralleled power switching devices may be generated. Due to the power switching device junction capacitance and circuit stray inductances, an oscillating circulating current may arise in the gate circuit of the power switching devices. The oscillating current in the gate path causes the junction capacitance to charge and discharge resulting in an oscillating gate voltage. The gate input of the power switching device may be configured to withstand a predetermined voltage. Gate voltages in excess of the predetermined voltage may degrade the power switching device. Power switching devices capable of faster switching speeds (e.g., Silicon Carbide MOSFET) may be more sensitive to the unbalanced junction capacitance and circuit stray inductance during paralleled operation. One solution is to decrease the switching speed which leads to higher switching losses. A preferred way may be to reduce the oscillations to ensure that the gate voltage stays below the predetermined voltage.

Figure 3:
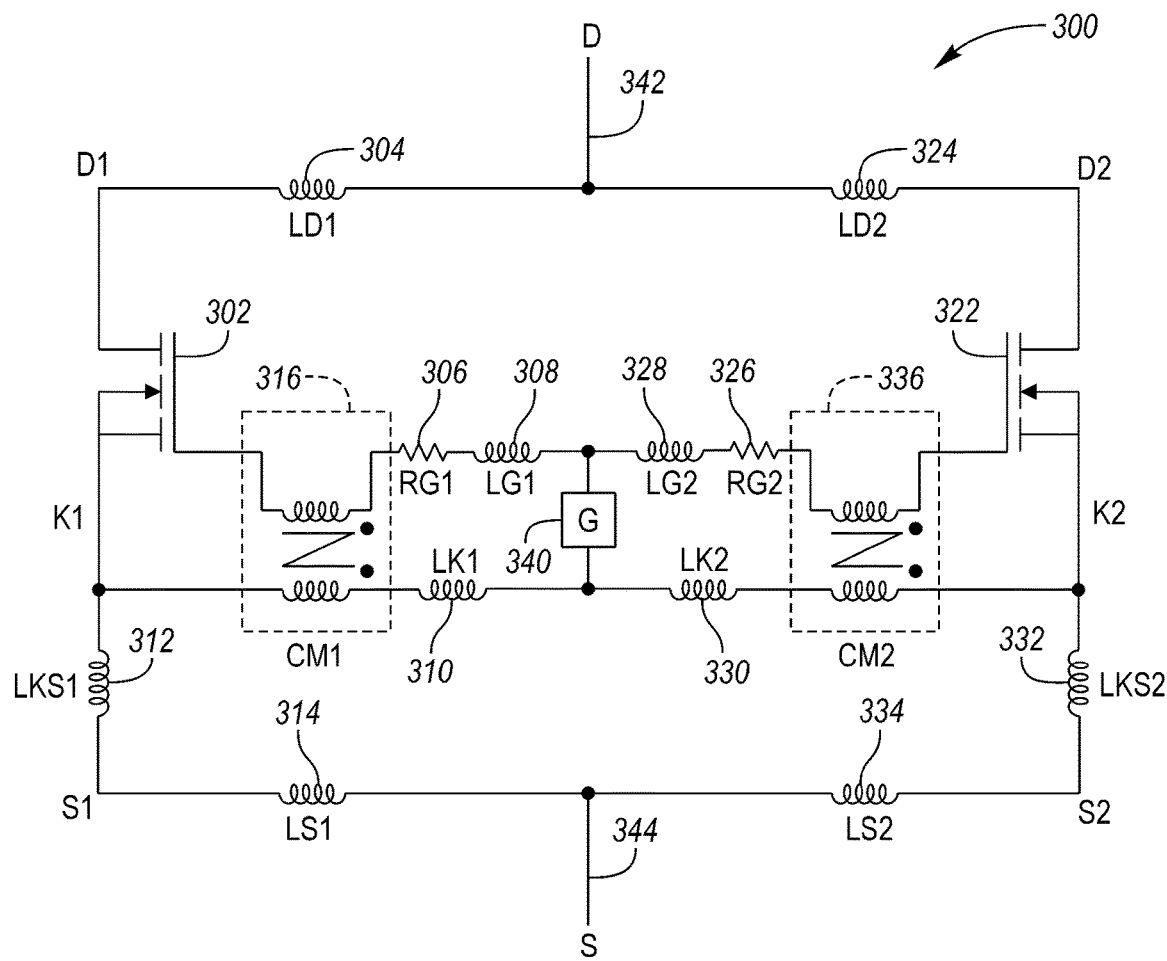
FIG. 3 is a schematic of a gate drive circuit for paralleled power switching devices

To eliminate or reduce the gate voltage oscillation of paralleled power switching devices, the gate loop impedance must be large enough to damp the oscillation current. However, a larger impedance in the gate loop reduces the gate current during switching transients which leads to reduced switching speeds and higher switching losses. FIG. 3 depicts a circuit diagram of a power module 300 having paralleled power switching devices (e.g., MOSFETs) with a common mode choke in the gate paths. The power module 300 may include a first power switching device 302 and a second power switching device 322. The power module 300 may have drain terminal 342 and a source terminal 344 for connecting to external circuits. Drain terminals of the first power switching device 302 and the second power switching device 322 may be electrically coupled to the drain terminal 342. The coupling for the first power switching device 302 may be characterized by a first drain stray inductance ($L_{D1}$) 304. The coupling for the second power switching device 322 may be characterized by a second drain stray inductance ($L_{D2}$) 324. In the example depicted, the power switching devices are MOSFETs. In a configuration in which the power switching devices are IGBTs, the collector (C) and emitter (E) terminals may be interchanged with the drain (D) and the source (S) terminals respectively.

Source terminals of the first power switching device 302 and the second power switching device 322 may be electrically coupled to the source terminal 344. The coupling for the first power switching device 302 may be characterized by a first source stray inductance ($L_{S1}$) 314. The coupling for the second power switching device 322 may be characterized by a second source stray inductance ($L_{S2}$) 334.

Gate terminals of the first power switching device 302 and the second power switching device 322 may be electrically coupled to a gate driver circuit 340. The coupling for the first power switching device 302 may be characterized by a first gate stray inductance ($L_{G1}$) 308 and first gate resistance ($R_{G1}$ 306). The coupling for the second power switching device 322 may be characterized by a second gate stray inductance ($L_{G2}$) 328 and second gate resistance ($R_{G2}$) 326. The gate driver circuit 340 may be an integrated circuit that is configured to provide proper gate signals for the power switching devices. The gate driver circuit 340 may ensure that proper voltage and current levels are applied to the gate inputs. The gate driver circuit 340 may be integrated with the power module 300 or may reside in an external printed circuit board (PCB).

Kelvin source/emitter terminals of the first power switching device 302 and the second power switching device 322 may be electrically coupled to the gate driver circuit 340. The coupling for the first power switching device 302 may be characterized by a first Kelvin source stray inductance ($L_{K1}$) 310. The coupling for the second power switching device 322 may be characterized by a second Kelvin source stray inductance ($L_{K2}$) 330.

The first power switching device 302 may be further characterized by a first Kelvin source to source stray inductance ($L_{KS1}$) that is the inductance between the Kelvin source terminal and the source terminal. The second power switching device 322 may be further characterized by a second Kelvin source to source stray inductance ($L_{KS2}$) that is the inductance between the Kelvin source terminal and the source terminal. Not shown, are the junction capacitances between each of the terminals of the first and second power switching devices (302, 322).

The power module further includes a first common mode choke (CM1) 316 coupled within the gate path and the Kelvin source path of the first power switching device 302. The power module further includes a second common mode choke (CM2) 336 coupled within the gate path and the Kelvin source path of the second power switching device 322. For normal gate currents that occur during switching transients, the equivalent impedance of the common mode chokes (316, 336) is zero. For oscillation currents that flow between the two power switching devices via the associated gate circuits, each winding of the common mode choke will have an equivalent impedance of the magnetizing inductance ($L_{CM}$) of the common mode choke. For each gate circuit of the paralleled power switching devices, an equivalent impedance of twice the $L_{CM}$ value is added into the oscillation current path. The common mode choke is also applicable to power modules that include more than two power switching devices. Use of the common mode chokes in the gate circuits reduces the peak value of the gate voltage oscillations. By adjusting the $L_{CM}$ value of the common mode choke, the peak value of the gate voltage oscillation may be altered. In general, increasing the $L_{CM}$ value results in a smaller gate oscillation current and a smaller magnitude of the gate voltage oscillation.

Figure 4:
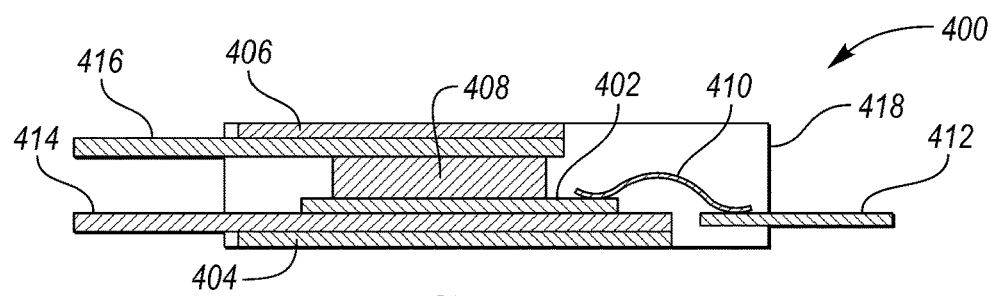
FIG. 4 is a possible configuration for a power module.
Figure 5:
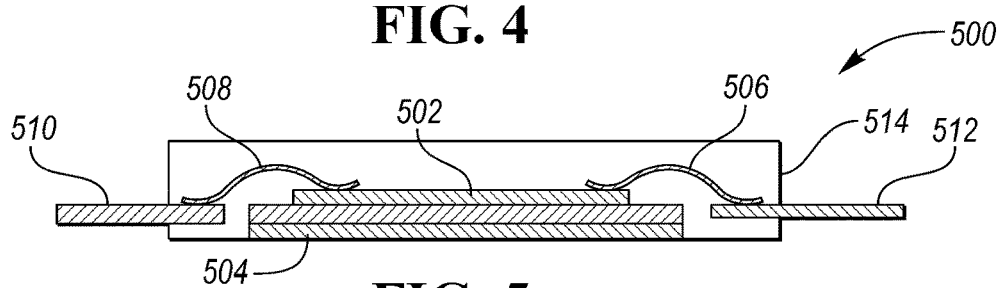
FIG. 5 is another possible configuration for a power module.

The common mode choke may be implemented in a variety of ways. In the power electronics module 126, one or more power switching devices may be packaged in a power module to increase power density and component reliability. FIGS. 4 and 5 depict possible layered structures for a power module. FIG. 4 depicts a first power module structure 400. The first power module structure 400 may include a bottom-side substrate 404. The first power module structure 400 may include a power switching device 402. The first power module structure 400 may include a first external power terminal 414 that is bonded between the bottom-side substrate 404 and the power switching device 402. The first external power terminal 414 may correspond to a drain or collector terminal of the power switching device 402.

The first power module structure 400 may include a second external power terminal 416 that is coupled to the power switching device 402 through a copper spacer 408. A top-side substrate 406 may be coupled to the second external power terminal 416. The top-side substrate 406 and the bottom-side substrate 404 may be constructed of copper and may include a layer of insulation. The second external power terminal 416 may correspond to a source or emitter terminal of the power switching device 402.

The first power module structure 400 may further include external control terminals 412 that are connected to the power switching device 402 through a wirebond connection 410. The external control terminals 412 may include a gate terminal and a Kelvin source/emitter terminal. The first power module structure 400 may include a casing 418 that encloses the structure. The casing 418 may be formed of plastic and/or ceramic material.

FIG. 5 depicts a second power module structure 500. The second power module structure 500 may include a substrate 504 that is coupled to a power switching device 502. The second power module structure 500 may include external power terminals 510 and external control terminals 512. The external power terminals 510 may be coupled to the power switching device 502 using first wirebond connections 508. The external power terminals 510 may include a source/emitter terminal and a drain/collector terminal. The external control terminals 512 may be coupled to the power switching device 502 using second wirebond connections 506. The second wirebond connections 506 may be configured to carry a rated current of the power switching device 502. The second power module structure 500 may include a casing 514 that encloses the structure. The casing 514 may be formed of plastic and/or ceramic material.

Figure 6:
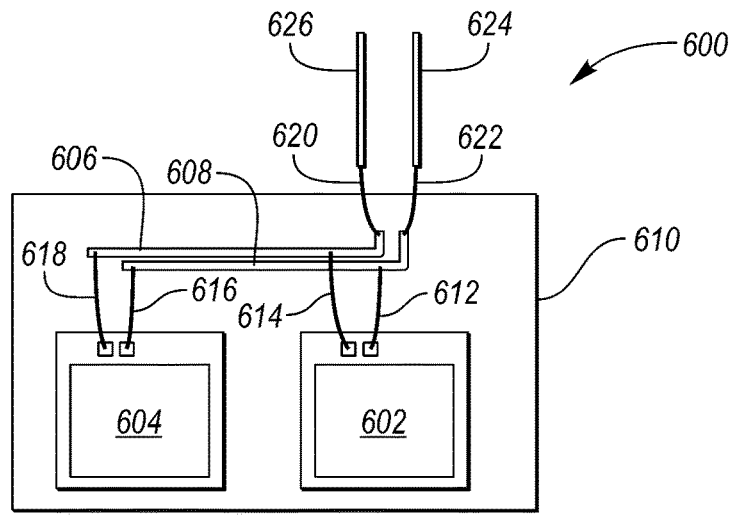
FIG. 6 is a possible configuration for paralleling power switching devices in an integrated power module.

FIG. 6 depicts a power module 600 that includes a first power switching device 602 and a second power switching device 604 that may be constructed as depicted in FIG. 4 or FIG. 5. The power module 600 may include a substrate 610. The first power switching device 602 and the second power switching device 604 may be coupled or bonded to the substrate 610. The substrate 610 may include a gate signal trace 606 and a Kelvin source/emitter trace 608. The gate signal trace 606 and the Kelvin source/emitter trace 608 may be copper traces that are etched into or attached to the substrate 610. The power module 600 includes an external gate control terminal 626 and an external Kelvin source/emitter terminal 624. The external gate control terminal 626 may be coupled to the gate signal trace 606 via a first wirebond connection 620. The external Kelvin source/emitter terminal 624 may be coupled to the Kelvin source/emitter trace 608 via a second wirebond connection 622.

The gate connection of the first power switching device 602 may be connected to the gate signal trace 606 via a third wirebond connection 614. The Kelvin source/emitter connection of the first power switching device 602 may be connected to the Kelvin source/emitter trace 608 via a fourth wirebond connection 612. The gate connection of the second power switching device 604 may be connected to the gate signal trace 606 via a fifth wirebond connection 618. The Kelvin source/emitter connection of the second power switching device 604 may be connected to the Kelvin source/emitter trace 608 via a sixth wirebond connection 616. The power module 600 may further include a gate driver circuit that is electrically connected to the gate signal trace 606 and the Kelvin source/emitter trace 608. The power module 600 may be enclosed in a case so that a single, integrated component is defined. The power module 600 connects the terminals of the first power switching device 602 and the second power switching device 604 within the power module 600. For improved performance, it may desirable to incorporate the common mode choke.

Figure 7:
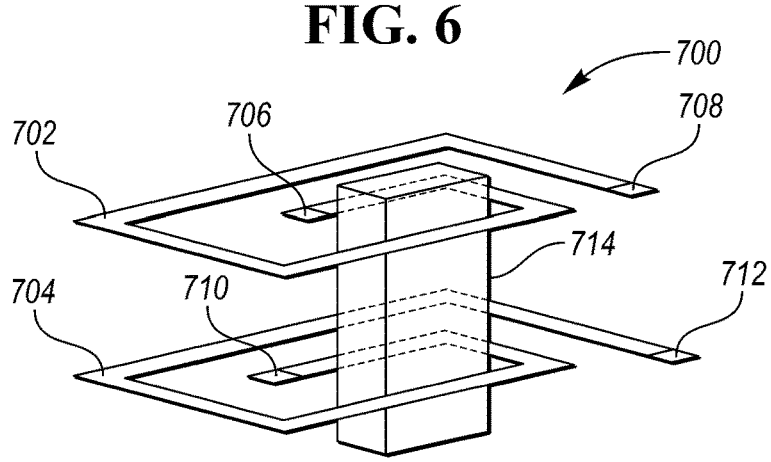
FIG. 7 is a possible configuration for a gate loop common mode choke.

FIG. 7 depicts a possible configuration for a gate loop common-mode (CM) choke 700. The CM choke 700 may include a first coil 702 and a second coil 704. The first coil 702 and the second coil 704 may formed of copper wires. The coils may be formed as copper traces in a substrate material. The first coil 702 and the second coil 704 may be in different planes or may be in the same plane. When the first coil 702 and the second coil 704 are implemented in different planes, the coil patterns may be the same except that the bottom-most coil may extend further at each end to allow for connection. When the first coil 702 and the second coil 704 are implemented in the same plane, the coils may be arranged concentrically. That is, one coil may completely surround the other, winding direction and the number of turns may be that same to form the CM choke 700. An optional magnetic core 714 may be inserted at a central position defined by the coils to tune the $L_{CM}$ value. For example, larger $L_{CM}$ values may be achieved by inserting a core 714 within the coils.

The first coil 702 and the second coil 704 may be comprised of wire which is insulated. For example, an electrical insulating material may be inserted between wires or the coil surface may be insulated. The coils may include terminals or connection points to facilitate electrical connections. The first coil 702 may have a first terminal 706 and a second terminal 708 that are located at opposite ends of the first coil 702. The second coil 704 may have a third terminal 710 and a fourth terminal 712 located at opposite ends of the second coil 704. The first terminal 706 and the third terminal 710 may be configured so that the terminals are offset from one another. The second terminal 708 and the fourth terminal 712 may be configured so that the terminals are offset from one another. This allows the connections to be exposed from at least one direction to facilitate connection with other components.

Figure 8:
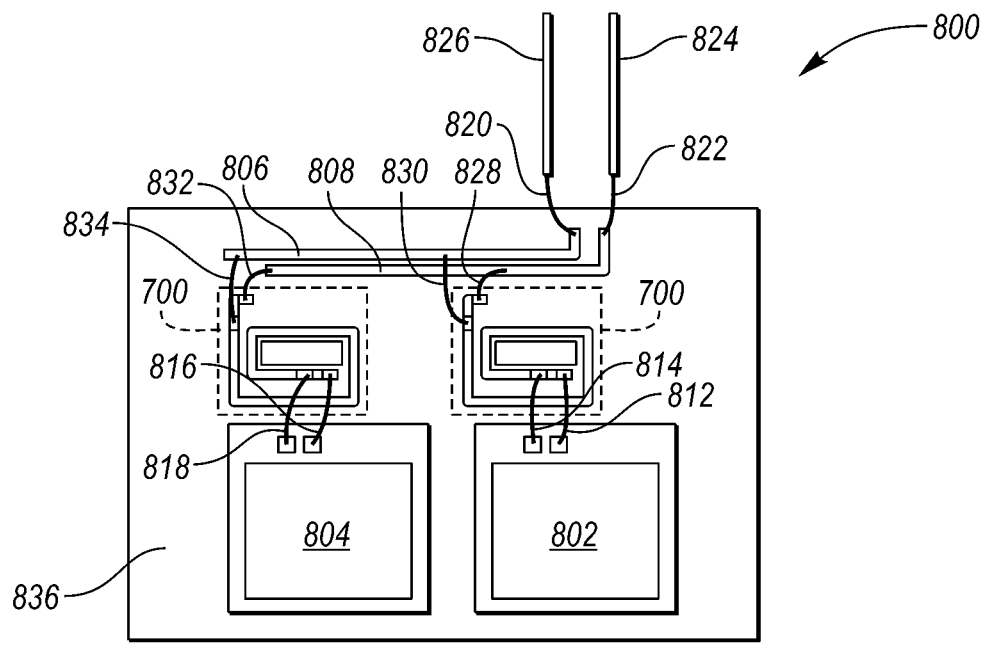
FIG. 8 is a possible configuration for paralleling power switching devices utilizing a common mode choke in a gate loop for each of the power switching devices.

FIG. 8 depicts a power module 800 that includes the CM choke 700. The power module 800 includes a first power switching device 802 and a second power switching device 804 that are coupled to a substrate 836. The power module 800 may include a gate signal trace 806 and a Kelvin source/emitter trace 808. The power module 800 may include an external gate control terminal 826 and an external Kelvin source/emitter terminal 824. The external gate control terminal 826 may be coupled to the gate signal trace 806 via a first wirebond connection 820. The external Kelvin source/emitter terminal 824 may be coupled to the Kelvin source/emitter trace 808 via a second wirebond connection 822.

The power module 800 may include a CM choke 700 electrically coupled between each power switching device and the gate and Kelvin source/emitter traces. One of the coils may be electrically coupled in the gate path to connect a gate input of the power switching devices to a common gate signal. One of the coils may be electrically coupled in a Kelvin source/emitter path to connects a Kelvin source/emitter output of the switching devices to a common control signal. A gate input of the first power switching device 802 may be coupled to a first terminal 706 of the first coil (e.g., 702) of the CM choke 700 by a third wirebond connection 814. A Kelvin source/emitter terminal of the first power switching device 802 may be coupled to a first terminal (e.g., 710) of the second coil 704 of the CM choke 700 by a fourth wirebond connection 812. The second terminal (e.g., 708) of the first coil 702 of the CM choke 700 may be coupled to the gate signal trace 806 by a fifth wirebond connection 830. The second terminal (e.g., 712) of the second coil 704 of the CM choke 700 may be coupled to the Kelvin source/emitter trace 808 by a sixth wirebond connection 828.

A gate input of the second power switching device 804 may be coupled to a first terminal (e.g., 702) of the first coil 702 of the CM choke 700 by a seventh wirebond connection 818. A Kelvin source/emitter terminal of the second power switching device 804 may be coupled to a first terminal (e.g., 710) of the second coil 704 of the CM choke 700 by an eighth wirebond connection 816. The second terminal (e.g., 708) of the first coil 702 of the CM choke 700 may be coupled to the gate signal trace 806 by a ninth wirebond connection 834. The second terminal (e.g., 712) of the second coil 704 of the CM choke 700 may be coupled to the Kelvin source/emitter trace 808 by a tenth wirebond connection 832.

The power module 800 includes a CM choke 700 for each power switching devices (e.g., 802, 804) that is paralleled. The example only depicts two power switching devices, but additional power switching devices may be paralleled in a similar manner using the CM choke 700. The power module 800 may be enclosed in a casing to protect the circuit and components. The power switching devices may be controlled by the external gate control terminal 826. The addition of the CM chokes 700 prevents oscillations in the gate signals. The power module 800 presents a common control interface (gate and Kelvin source/emitter terminals) to the external environment. By integrating the CM chokes 700 into the power module 800, gate voltage oscillations can be reduced or eliminated. The external circuitry interfaces with the power module 800 in the same manner no matter how many power switching devices are integrated into the power module 800.

The control interface of the configuration of FIG. 8 includes the external gate control terminal 826 and the external Kelvin source/emitter terminal 824. The external gate control terminal 826 and the external Kelvin source/emitter terminal 824 are connected respectively to the common gate signal trace 806 and the common Kelvin source/emitter trace 808. In other configurations, each of the power switching devices (e.g., 802, 804) may be coupled to separate external gate control terminals and Kelvin source/emitter terminals. That is, the external interface to the power module is a gate control terminal and a Kelvin source/emitter terminal for each power switching device that is included in the power module. A connection between the gate control terminals and the Kelvin source/emitter terminals may be made external to the power module.

Figure 9:
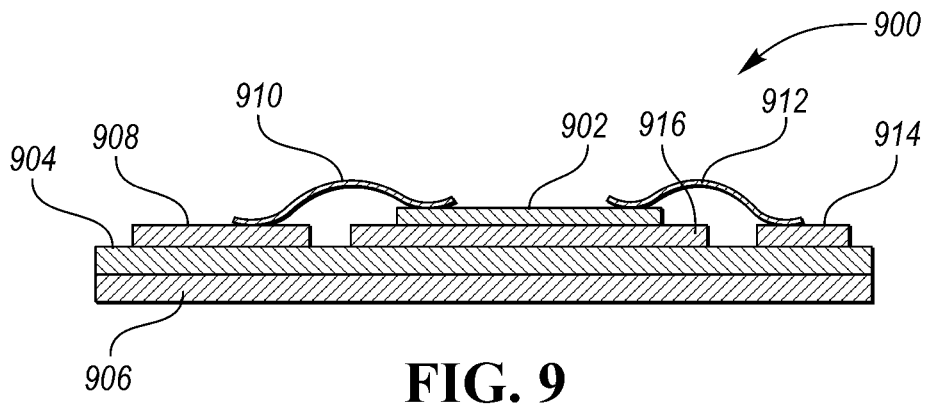
FIG. 9 is a possible configuration for a direct bonded copper power module.

The power modules may include direct bonded copper (DBC) substrates. FIG. 9 depicts a possible first DBC structure 900. The first DBC structure 900 includes a bottom copper layer 906 coupled to a ceramic layer 904. An upper copper layer is coupled to the other side of the ceramic layer 904. The upper copper layer may be etched to define one or more traces. For example, the upper copper layer may include a first copper trace 916 to which the power switching device 902 is bonded. The first copper trace 916 may define a signal or power path. The upper copper layer may include second copper trace 914 that defines a signal or power path. The second trace 914 may be connected to an associated terminal of the power switching device 902 using a first wirebond connection 912. The upper copper layer may include a third copper trace 908 that defines a signal or power path. The third copper trace 908 may be connected to an associated terminal of the power switching device 902 using a second wirebond connection 910.

Figure 10:
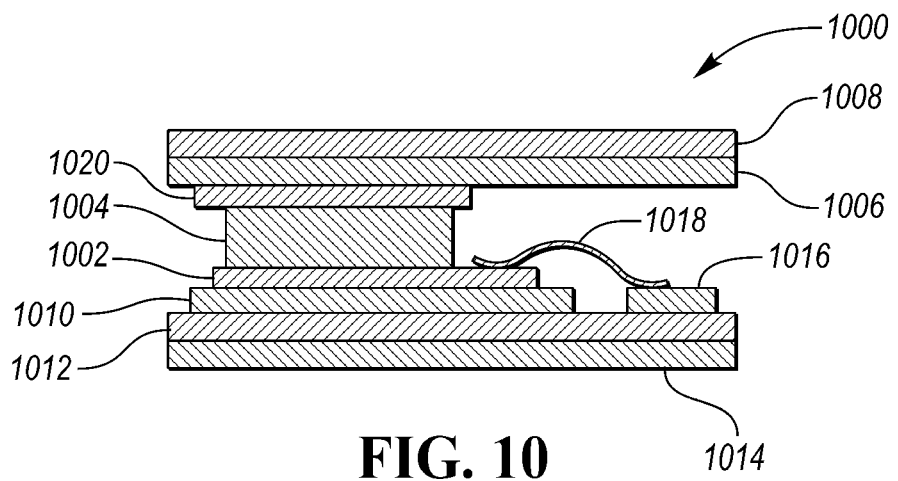
FIG. 10 is another possible configuration for a direct bonded copper power module.

FIG. 10 depicts a possible second DBC structure 1000. The second DBC structure 1000 may include a bottom copper layer 1014 that is coupled to a first ceramic layer 1012. The other side of the first ceramic layer 1012 may be coupled to a first power/signal copper layer 1010. The first power/signal copper layer 1010 may include a copper trace 1016 for carrying signal or power, the first power/signal copper layer 1010 may be coupled to a power switching device 1002. For example, the first power/signal copper layer 1010 may include a copper trace for power signals. The copper trace 1016 may be connected to associated terminals of the power switching device 1002 using a wirebond connection 1018.

A copper spacer 1004 may be coupled to the other side of the power switching device 1002 and may provide electrical continuity for a power signal. The second DBC structure 1000 may include a top copper layer 1008, below which a second ceramic layer 1006 is bonded. A second power/signal copper layer 1020 may be coupled between the second ceramic layer 1006 and the copper spacer 1004. The second power/signal copper layer 1020 may provide a conductive path for one or more of the power signals.

Figure 11:
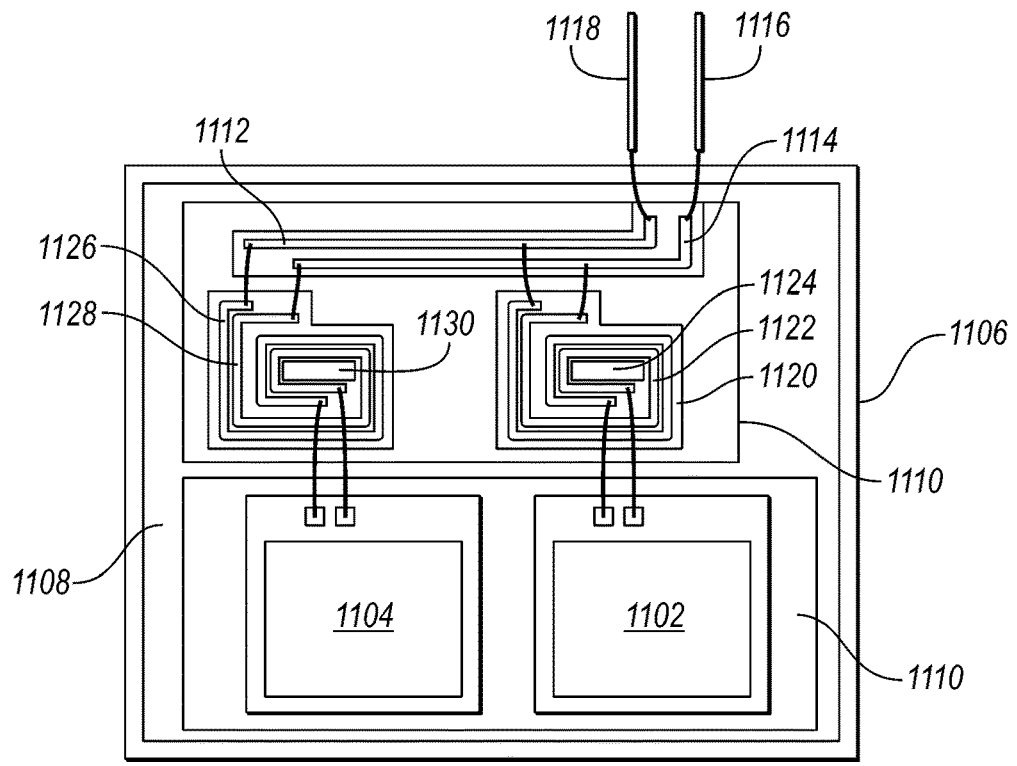
FIG. 11 is a possible configuration for paralleling power switching devices for direct bonded copper power modules utilizing a common mode choke formed in one of the direct bonded copper layers.

FIG. 11 depicts a possible power module 1100 based on a DBC structure. The power module 1100 further includes CM chokes in the gate paths of the paralleled power switching devices. The CM chokes may be implemented as part of the DBC structure. The power module 1100 may include a bottom-most copper layer 1106. Directly above the bottom-most copper layer 1106 may be a ceramic layer 1108. Coupled to the ceramic layer may be a power/signal copper layer 1110. A first power switching device 1102 and a second power switching device 1104 may be coupled to the power/signal copper layer 1110.

The power/signal copper layer 1110 may include a gate signal trace 1112 and a Kelvin source/emitter trace 1114 that may be etched or otherwise formed in the power/signal copper layer 1100. CM chokes may be defined by etching coils into the power/signal copper layer 1100. For example, a first outer coil 1120 and a first inner coil 1122 may be etched into the power/signal copper layer 1100. The first outer coil 1120 may be electrically coupled at a first end to the gate signal trace 1112 and at a second end to a gate terminal of the first power switching device 1102. The first inner coil 1122 may be electrically coupled at a first end to the Kelvin source/emitter trace 1114 and at a second end to a Kelvin source/emitter terminal of the first power switching device 1102. The electrical coupling may be via wirebond connections. The first outer coil 1120 and the first inner coil 1122 may be defined such that traces defining the coils are isolated from one another. The coils may be formed in a square/rectangular pattern. The coils may also be formed in a circular pattern. An optional first core 1124 may be inserted at a central position defined by the first outer coil 1120 and the first inner coil 1122 to achieve a desired LCM value.

A second outer coil 1126 and a second inner coil 1128 may be etched into the power/signal copper layer 1100. The second outer coil 1126 may be electrically coupled at a first end to the gate signal trace 1112 and at a second end to a gate terminal of the second power switching device 1104. The second inner coil 1128 may be electrically coupled at a first end to the Kelvin source/emitter trace 1114 and at a second end to a Kelvin source/emitter terminal of the second power switching device 1104. The electrical coupling may be via wirebond connections. An optional second core 1130 may be inserted at a central position defined by the second outer coil 1126 and the second inner coil 1128 to achieve a desired $L_{CM}$ value.

The power module 1100 may include an external gate terminal 1118 and an external Kelvin source/emitter terminal 1116 for interfacing with other circuits. For example, the external terminals may be connected to a gate driver circuit.

Figure 12:
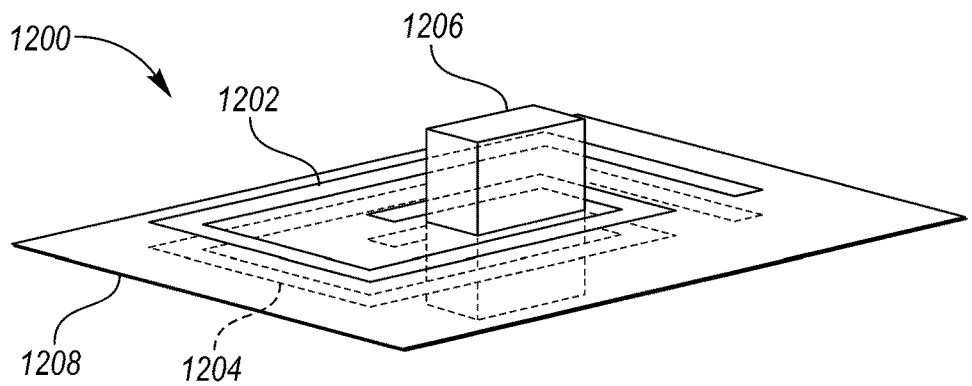
FIG. 12 is a top view of a possible configuration for a common mode choke implemented on a printed circuit board.

The CM chokes may also be implemented on a printed circuit board (PCB). FIG. 12 depicts a possible implementation of PCB CM choke 1200. The PCB CM choke 1200 may be formed on a circuit board 1208. For example, a first coil 1202 may be formed/etched onto a first surface (e.g., top) of the circuit board 1208. The first coil 1202 may be formed by a copper trace formed in a coil. A second coil 1204 may be formed/etched onto a second surface (e.g., bottom) of the circuit board 1208 in a manner similar to the first coil 1202. The PCM CM choke 1200 may include an optional core 1206. For example, the circuit board 1208 may define an opening into which the core 1206 may be inserted. The first coil 1202 and the second coil 1204 may define connection points for each end of the coil. The connection points may be defined on one of the surfaces of the circuit board 1208. For example, if the connection points are to be defined on the same surface as the second coil 1204, then the connection points of the first coil 1202 may be routed through the circuit board 1208 to the other side. Through holes may be defined to electrically connect one surface to the other.

Figure 13:
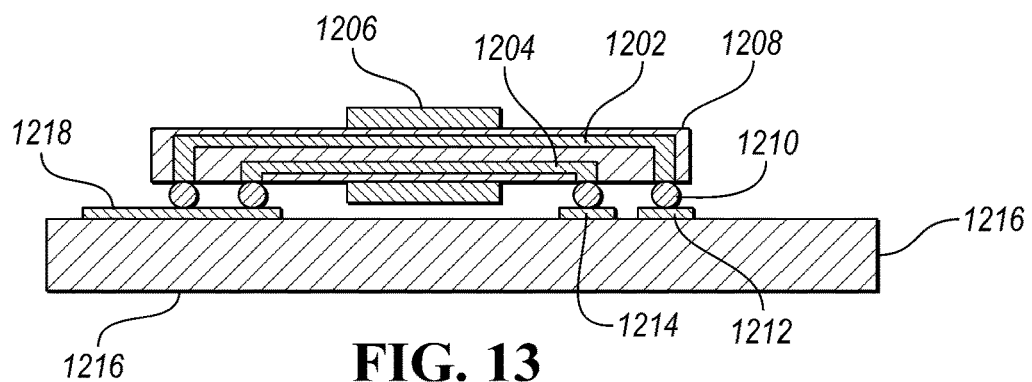
FIG. 13 is a side view of a possible configuration for a common mode choke implemented on a printed circuit board and coupled to a power module.

FIG. 13 depicts a side-view of a PCM CM choke that is integrated with a power switching device 1218. The power switching device 1218 may be coupled to a substrate 1216. A gate signal trace 1212 and a Kelvin source/emitter trace 1214 may be defined on the substrate 1216. The circuit board 1208 may be connected to the power module assembly via solder balls 1210 at each point where electrical connection is desired. For example, a solder ball 1210 may be placed at a position on the gate signal trace 1212 and at a gate terminal of the power switching device 1218. A first end and a second end of the first coil 1202 may correspond to the solder ball 1210 positions. Additional solder balls may be placed at a position on the Kelvin source/emitter trace 1214 and at a Kelvin source/emitter terminal of the power switching device 1218. When melted, the solder balls 1210 may mechanically and electrically couple the PCB CM choke to the power module assembly.

Figure 14:
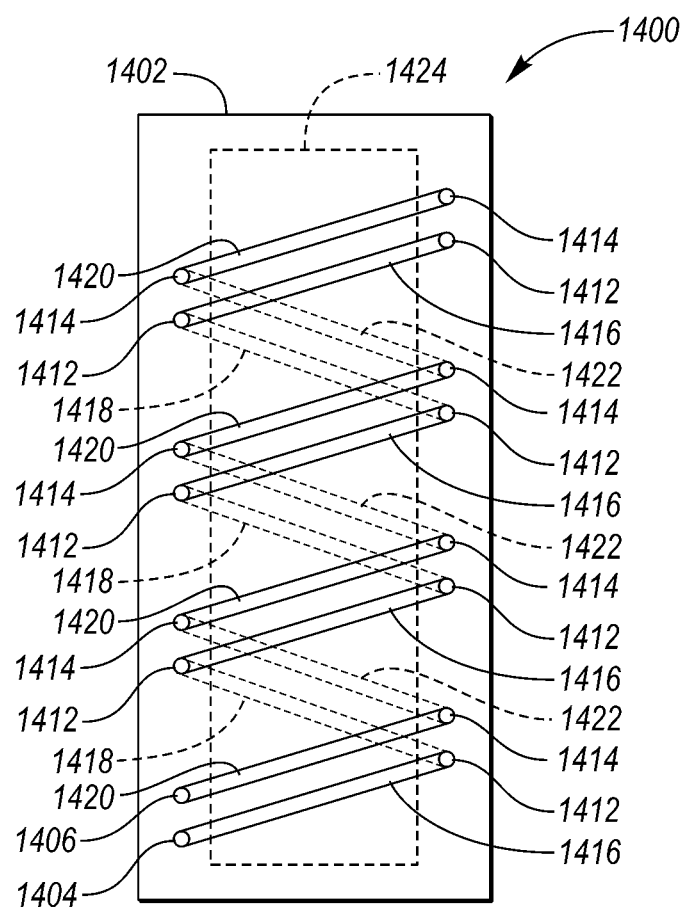
FIG. 14 is another possible configuration for a common mode choke implemented on a printed circuit board.

FIG. 14 depicts an alternative configuration for a PCB CM choke 1400. In this configuration, the coils may be defined by traces on both sides of a circuit board 1402. For example, on a top-side of the circuit board 1402, a first set

1416 of conductive traces may be defined. The first set 1416 may correspond to a first coil. On a bottom-side of the circuit board 1402, a second set 1418 of conductive traces may be defined. A first group of conductive through holes 1412 may be defined to electrically couple end-points of the first set 1412 of conductive traces to end-points of the second set 1418 of conductive traces. The conductive through holes 1412 may provide a conductive path from one side of the PCB to the other side. The first set 1412 and the second set 1418 are connected to form a coil-like structure about the circuit board 1402. A first end-point 1404 may define a first end of the first coil and a second end-point 1408 may define a second end of the first coil.

On the top-side of the circuit board 1402, a third set 1420 of conductive traces may be defined. The third set 1420 may correspond to a second coil. On a bottom-side of the circuit board 1402, a fourth set 1422 of conductive traces may be defined. A second group of conductive through holes 1414 may be defined to electrically couple end-points of the third set 1420 of conductive traces to end-points of the fourth set 1422 of conductive traces. The third set 1420 and the fourth set 1422 are connected to form a coil-like structure about the circuit board 1402. A first end-point 1406 may define a first end of the second coil and a second end-point 1410 may define a second end of the second coil.

An optional core 1424 may be placed within the coils to achieve larger $L_{CM}$ values. For example, the circuit board 1402 may define an opening into which the core 1424 may be inserted.

Figure 15:
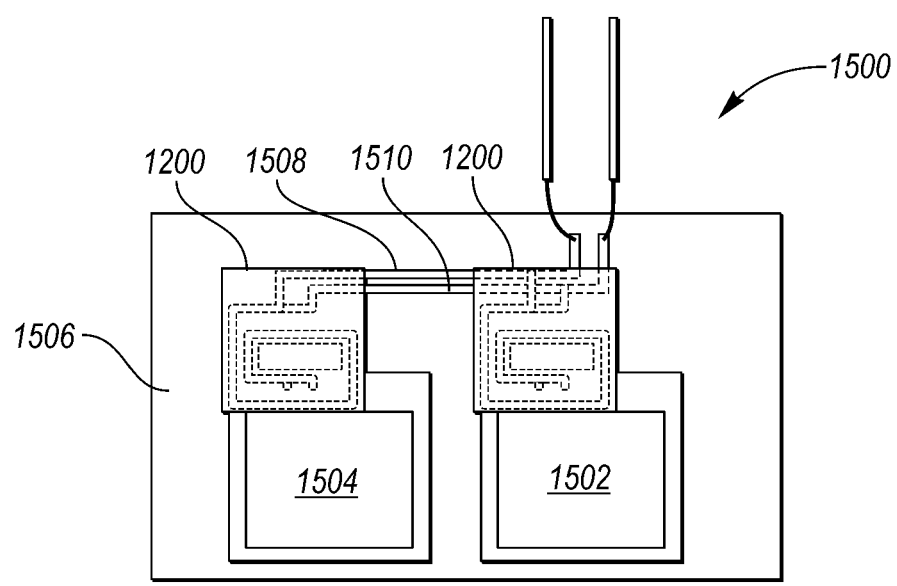
FIG. 15 is a possible configuration for paralleling power modules using a common mode choke implemented on a printed circuit board.

FIG. 15 depicts a power module that utilizes the PCB CM choke (e.g., 1200). The power module includes a substrate 1506 to which a first power switching device 1502 and a second power switching device 1504 are mounted. The power module includes a gate signal trace 1508 and a Kelvin source/emitter trace 1510. A PCB CM choke 1200 may be mounted such that a first connection is aligned with a gate terminal of the first power switching device 1502 and a second connection is aligned with the gate signal trace 1508. The first connection and the second connection may be defined at ends of one of the coils. Further, a third connection is aligned with a Kelvin source/emitter terminal of the first power switching device 1502 and a fourth connection is aligned with the Kelvin source/emitter trace 1510. The third connection and the fourth connection are defined at ends of one of the coils. A PCM CM choke 1200 may be similarly mounted between the second power switching device 1504 and the gate signal trace 1508 and the Kelvin source/emitter trace 1510. The connections may be soldered to maintain the connections. In other configurations, multiple PCB CM chokes may be formed on a single circuit board. The single circuit board may then be installed in place of the multiple circuit boards.

In some configurations, the power switching devices may not be combined in a single power module. Rather, individual power switching devices may be paralleled by external connections. Power connections of each power switching device may be connected via bus bars. Control terminals may be connected on a gate drive circuit board. A common mode choke may also be implemented for these configurations.

Individual power modules may be designed to implement the common mode choke from the gate and Kelvin source/emitter terminals to the external terminals. The CM choke may be implemented in a single power module similar to the configurations depicted in FIG. 8 or FIG. 11. In other configurations, the PCB described in FIGS. 12-14 may also be incorporated into a single power module. The external control terminals may be constructed of wire or lead frame. The lead frames may be routed to form coils in the manner described previously.

Figure 16:
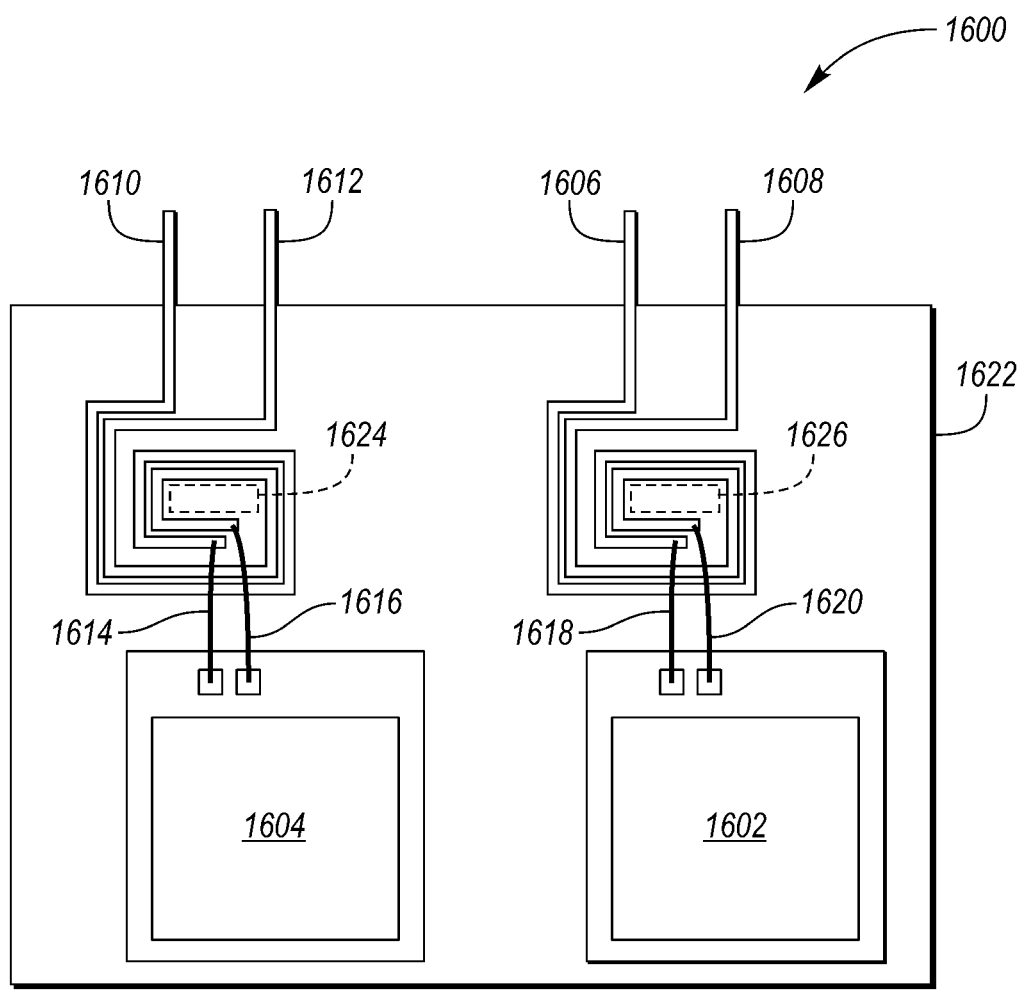
FIG. 16 is a possible configuration for multiple power switching devices in a power module with a common mode choke formed from wires.

FIG. 16 depicts a power module 1600 in which the CM choke is formed from wires or conductors that form the external interface. The power module 1600 may include a first power switching device 1602 and a second power switching device 1604 mounted on a substrate 1622. A first wire 1606 may be formed into a first coil. An end of the first wire 1606 may be accessible external to the power module 1600. A second wire 1608 may be formed into a second coil. An end of the second wire 1608 may be accessible external to the power module 1600. The first coil and the second coil may define concentric coils in a same plane or may define nearly identical coils in different planes. A first magnetic core 1626 may be positioned in a central area defined by the first and second coils. Another end of the first wire 1606 may be electrically coupled to a gate terminal of the first power switching device 1602 via a first wirebond connection 1618. Another end of the second wire 1608 may be electrically coupled to a Kelvin source/emitter terminal of the first power switching device 1602 via a second wirebond connection 1620.

A third wire 1610 may be formed into a third coil. An end of the third wire 1610 may be accessible external to the power module 1600. A fourth wire 1612 may be formed into a fourth coil. An end of the fourth wire 1612 may be accessible external to the power module 1600. The first coil and the second coil may define concentric coils in a same plane or may define nearly identical coils in different planes. A second magnetic core 1624 may be positioned in a central area defined by the first and second coils. Another end of the third wire 1610 may be electrically coupled to a gate terminal of the second power switching device 1604 via a third wirebond connection 1614. Another end of the fourth wire 1612 may be electrically coupled to a Kelvin source/emitter terminal of the second power switching device 1604 via a fourth wirebond connection 1616.

The power module 1600 may be enclosed in a case. The control interface to the power module includes ends of the wires that are accessible external to the power module 1600. For example, the ends of the wires may form pins or terminals for coupling the power module 1600 to a circuit board. In this configuration, each coil of the CM choke is formed by a piece of wire shaped as a coil. In this configuration, the external gate terminals (e.g., defined by wires 1606 and 1610) may be externally connected together to a common gate control signal. The external Kelvin source/emitter terminals (e.g., defined by wires 1608 and 1612) may be externally connected together to a common control signal.

In other configurations, the gate loop CM choke may be implemented outside of the power modules. For example, a CM choke may be installed on a gate driver board. The power module control terminals may be connected to the gate driver board and signals may be routed through the CM choke. The CM choke may also be connected to the gate driver circuit. The gate driver board may also be used to form the CM chokes as described in relation to FIGS. 12-14.

An advantage of adding the CM choke in the gate circuit is that oscillations are prevented that may cause excessive gate voltages. The benefit may be obtained without increasing switching transient time and switching loss associated with the power semiconductor. The gate drive loop has a small current so any extra losses caused by the CM choke are negligible. The CM chokes described herein may be implemented within the power module or on the gate drive board which provides opportunities for reducing cost. The implementations within the power module use existing structures and have limited impact on the power module structure and volume. The $L_{CM}$ value may be easily tuned during the design phase to achieve a desirable value. The addition of the CM chokes for each power semiconductor allows multiple power semiconductors to be paralleled without oscillations in the gate voltages.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A power module comprising:
   a plurality of switching devices, electrically coupled in parallel and triggered by a common gate signal, attached to a substrate that includes a first coil and a second coil that are formed as traces in the substrate around a common axis to define a common mode choke in a gate path and a Kelvin source/emitter path of each of the switching devices.

2. The power module of claim 1 wherein a gate input of the switching devices is connected to the common gate signal through one of the first coil and the second coil.

3. The power module of claim 1 wherein a Kelvin source/emitter output of the switching devices is connected to a common control signal through one of the first coil and the second coil.

4. The power module of claim 1 wherein a number of turns of the first coil is equal to a number of turns of the second coil.

5. The power module of claim 1 further comprising a magnetic core inserted at a central position defined by the first coil and the second coil.

6. The power module of claim 1 further comprising an electrical insulating material between the first coil and the second coil.

7. The power module of claim 1 wherein the first coil and the second coil are in different planes of the substrate.

8. The power module of claim 1 wherein the second coil is concentric to the first coil.

9. A power module comprising:
   a plurality of switching devices, electrically coupled in parallel and triggered by a common gate signal, attached to a substrate that includes a first trace and a second trace formed around a common axis in different planes of the substrate to define a common mode choke in a gate path and a Kelvin source/emitter path of each of the switching devices.

10. The power module of claim 9 wherein one of the first trace and the second trace forms a coil in the gate path that connects a gate input of the switching devices to the common gate signal.

11. The power module of claim 9 wherein one of the first trace and the second trace forms a coil in the Kelvin source/emitter path that connects a Kelvin source/emitter output of the switching devices to a common control signal.

12. The power module of claim 9 wherein a number of turns of the first trace is equal to a number of turns of the second trace.

13. The power module of claim 9 further comprising a magnetic core inserted at a central position defined by the first trace and the second trace.

14. The power module of claim 9 wherein the first trace and the second trace are formed as copper traces on respective planes of the substrate.

15. A traction inverter comprising: a plurality of switching devices, electrically coupled in parallel and triggered by a common gate signal; and a printed circuit board including traces formed around a common axis that define a pair of windings for a common mode choke in a gate path and a Kelvin source/emitter path of each of the switching devices.

16. The traction inverter of claim 15 wherein the traces define the pair of windings in different planes of the printed circuit board.

17. The traction inverter of claim 15 wherein the traces define the pair of windings such that each of the windings includes traces on different planes of the printed circuit board.

18. The traction inverter of claim 15 further comprising a magnetic core inserted in an opening defined by the printed circuit board and located within a central region defined by the windings.

19. The traction inverter of claim 15 wherein the windings form a first coil in the gate path that connects a gate input of the switching devices to the common gate signal and a second coil in the Kelvin source/emitter path that connects a Kelvin source/emitter output of the switching devices to a common control signal.

* * * * *